(12) United States Patent
Eun

(10) Patent No.: US 7,879,733 B2
(45) Date of Patent: Feb. 1, 2011

(54) METHOD FOR MANUFACTURING SEMICONDUCTOR DEVICE FREE FROM LAYER-LIFTING BETWEEN INSULATING LAYERS

(75) Inventor: Byung Soo Eun, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 405 days.

(21) Appl. No.: 11/647,089

(22) Filed: Dec. 27, 2006

(65) Prior Publication Data

US 2008/0003766 A1 Jan. 3, 2008

(30) Foreign Application Priority Data

Jun. 29, 2006 (KR) .................. 10-2006-0059906

(51) Int. Cl.
H01L 21/302 (2006.01)
(52) U.S. Cl. ...................... 438/723; 438/396
(58) Field of Classification Search .................. None
See application file for complete search history.

(56) References Cited

U.S. PATENT DOCUMENTS

| 6,287,905 B2 | 9/2001 | Kim et al. .................. 438/197 |
| 6,461,911 B2 * | 10/2002 | Ahn et al. .................. 438/253 |
| 6,528,418 B1 | 3/2003 | Kim et al. .................. 438/672 |
| 6,818,552 B2 * | 11/2004 | Daniels et al. .............. 438/638 |
| 7,482,245 B1 * | 1/2009 | Yu et al. ...................... 438/435 |
| 2001/0046777 A1 * | 11/2001 | Kim et al. .................... 438/702 |
| 2003/0116854 A1 * | 6/2003 | Ito et al. ..................... 257/761 |
| 2006/0105578 A1 * | 5/2006 | Hong et al. ................ 438/723 |

FOREIGN PATENT DOCUMENTS

| JP | 08-162449 | * | 6/1996 |
| KR | 10-1998-0005374 | | 3/1998 |
| KR | 10-2003-0027453 | | 4/2003 |
| KR | 10-2005-0111199 | | 11/2005 |

* cited by examiner

*Primary Examiner*—Thanh V Pham
*Assistant Examiner*—Mohammad Choudhry
(74) *Attorney, Agent, or Firm*—Marshall, Gerstein & Borun LLP

(57) ABSTRACT

A method for manufacturing a semiconductor device free from layer lifting between insulating layers. The method comprises forming a silicon oxide layer on a semiconductor substrate, forming a silicon rich oxynitride (SRON) layer as an etching mask on the silicon oxide layer, selectively removing the SRON layer used as the etching mask, performing surface treatment to the silicon oxide layer using plasma of a reaction gas containing oxygen to cure a portion of the silicon oxide layer contaminated by the SRON layer, and forming a silicon nitride layer on the surface-treated silicon oxide layer to have compressed stress by PE-CVD. The method effectively prevents the short-circuit phenomenon between metal contacts, thereby embodying an increase in yield of a semiconductor manufacturing process.

6 Claims, 9 Drawing Sheets

METHOD FOR MANUFACTURING SEMICONDUCTOR DEVICE FREE FROM LAYER-LIFTING BETWEEN INSULATING LAYERS

CROSS REFERENCE TO RELATED APPLICATION

The present application claims priority to Korean Patent Application Number 10-2006-059906, filed on Jun. 29, 2006, which is incorporated by reference in its entirety.

BACKGROUND OF THE INVENTION

The invention relates to a method for manufacturing a semiconductor device, more particularly, to a method for manufacturing a semiconductor device free from layer-lifting between insulating layers.

With rapid advances in technology of semiconductor devices toward a reduced design rule and finer patterns, certain manufacturing processes requires depositing different kinds of insulating layers.

To enable control of etching or polishing by means of etching or etching stop, a silicon nitride ($Si_3N_4$) layer is often deposited as an etching (or polishing) stop layer on a silicon oxide ($SiO_2$) layer. In this regard, when such different kinds of layers are deposited, interlayer defects such as layer-lifting may occur due to different characteristics between the layers. The layer-lifting between the layers can cause cracks between the layers.

In the case where a silicon rich oxynitride (SRON) layer is formed as a hard mask on the silicon oxide layer to realize an etching selection ratio or a polishing selection ratio, layer lifting of the silicon nitride layer may occur more frequently when the silicon nitride layer is deposited on the silicon nitride layer from which the SRON layer used as the hard mask is removed.

The cracks may be generally exposed to a contact hole penetrating the insulating layers. Hence, when a contact layer, for example, a metal layer, is deposited into the contact hole to fill the contact hole, the cracks cause a bridge phenomenon between contacts, lines or elements since the metal layer is deposited in the cracks exposed to the contact hole.

FIGS. 1 and 2 are schematic cross-sectional views showing the bridge phenomenon caused by the layer-lifting in a conventional semiconductor device.

Referring to FIGS. 1 and 2, as the design rule of the semiconductor device, for example, DRAM, is reduced, a capacitor 40 is preferably embodied in a three-dimensional structure such as a cylindrical capacitor on a first insulating layer 10 which comprises a silicon oxide layer.

Here, before deposition of a storage electrode 41, a dielectric film 43, and a plate electrode 45 for implementation of this three-dimensional capacitor 40, a storage electrode contact 11 is formed through the first insulating layer 10 to electrically connect the capacitor 40 to a semiconductor substrate (not shown) below the capacitor 40 or to a transistor (not shown). To form a contact hole for the storage electrode contact 11, an SRON hard mask (not shown) is preferably formed on the first insulating layer 10.

After the storage electrode contact 11 is formed, a silicon nitride layer 20 is formed as an etching stop layer on the first insulating layer 10 from which the hard mask is removed. Then, in order to embody the storage electrode 41 in a cylindrical shape, a second insulating layer 30 to act as an insulating mold on the silicon nitride layer 20 is formed to have an opening hole 31 therethrough, and comprises a silicon oxide layer. Here, it can be understood that the silicon nitride layer 20 is formed as the etching stop layer when etching the opening hole 31.

As such, after forming the capacitor 40, a third insulating layer 50 is formed to cover the capacitor 40, and a contact hole 51 is formed to penetrate the third insulating layer 50. Then, as shown in FIG. 2, line layers 60 such as M1, for example, a barrier metal layer 61 and a line metal layer 63, are formed to fill the contact hole 51. In this regard, it can be understood that the line layers 60 are formed together with a metal contact 65, such as M1C, which fills the contact hole 51.

Meanwhile, on an interface between the silicon nitride layer 20 and the silicon oxide layer of the first insulating layer 10, layer-lifting of the silicon nitride layer 20 can occur due to differences in bonding characteristics between the different kinds of insulating materials. Furthermore, when the SRON hard mask is provided, the interlayer characteristics between the first insulating layer 10 and the silicon nitride layer 20 deteriorate, causing more significant layer-lifting. In addition, since the silicon nitride layer 20 is formed by low pressure plasma deposition of silicon nitride generally causing higher tensile stress in a furnace, the layer-lifting of the silicon nitride layer 20 can be further activated due to the tensile stress.

Cracks 21 can be created in the interface due to the layer-lifting, and act as a path connecting the two line layers 60 or two metal contacts 65, which line layers and metal contacts must be independent of each other. As a result, when the barrier metal layer 61 is deposited in the contact hole, it can be undesirably deposited on the cracks 21, so that a bridge 23 can be formed to electrically connect the metal contacts 65.

As such, the layer-lifting causes the bridge 23, in particular, between the metal contacts 65 in a surrounding region rather than a cell region, which results in electrical short circuit of the components of the device.

There are needs of a method which can prevent the layer-lifting on the interface between the insulating layers to secure reliability in operation of the device.

SUMMARY OF THE INVENTION

The invention provides a method for manufacturing a semiconductor device, which can prevent layer-lifting on an interface between a silicon oxide layer and a silicon nitride layer when depositing the insulating layers of different kinds of insulating materials.

In accordance with one aspect, the invention provides a method for manufacturing a semiconductor device, comprising forming a silicon oxide layer on a semiconductor substrate; forming a silicon rich oxynitride (SRON) layer to act as an etching mask on the silicon oxide layer; selectively removing the SRON layer used as the etching mask; performing surface treatment to the silicon oxide layer using plasma of a reaction gas containing oxygen to recover a portion of the silicon oxide layer contaminated by the SRON layer; and forming a silicon nitride layer on the surface-treated silicon oxide layer.

In accordance with another aspect, the invention provides a method for manufacturing a semiconductor device, comprising forming a silicon oxide layer on a semiconductor substrate; forming a silicon rich oxynitride (SRON) layer to act as an etching mask on the silicon oxide layer; selectively removing the SRON layer used as the etching mask; performing surface treatment to the silicon oxide layer using plasma of a reaction gas containing oxygen to recover a portion of the silicon oxide layer contaminated by the SRON layer; forming a silicon nitride layer on the surface-treated silicon oxide layer; forming a mold insulating layer on the silicon nitride layer; selectively etching the mold insulating layer using the silicon nitride layer as an etching stop layer to form a via-opening hole through the mold insulating layer; forming a storage electrode, a dielectric film and a plate electrode in the via-opening hole; forming an upper insulating layer on the plate electrode; forming a via-contact hole through the upper insulating layer, the mold insulating layer, the silicon nitride layer and the silicon oxide layer; and forming a metal layer on the upper insulating layer so as to fill the via-contact hole to form a metal line layer and a metal contact.

The surface treatment is preferably performed to change the portion of the silicon oxide layer contaminated by silicon of the silicon rich oxynitride (SRON) layer into a normal silicon oxide.

The surface treatment is preferably performed in such a way to process the surface of the silicon oxide layer using the plasma generated by exciting the reaction gas comprising oxygen gas (O2) and helium gas (He).

The surface treatment preferably comprises applying a bias toward the semiconductor substrate to allow the surface of the silicon oxide layer to be etched by the plasma.

The method preferably further comprises etching the silicon oxide layer using the SRON layer as the etching mask to form a second via-contact hole; and forming a conductive layer to fill the second via-contact hole so as to form a connection contact connected to the storage electrode.

DESCRIPTION OF SPECIFIC EMBODIMENTS

In one embodiment of the invention, interlayer characteristics between a silicon nitride layer and a silicon oxide layer can be improved by desirably modifying surface characteristics of the silicon oxide layer after removing a SRON layer formed to act as a hard mask on the silicon oxide layer. Here, surface treatment can be performed using oxygen plasma on a surface of the silicon oxide layer, from which the SRON layer is removed, to compensate influence of the SRON layer on the surface of the silicon oxide layer.

Since the SRON layer contains a rich amount of silicon, the silicon oxide layer, for example, a high density plasma (HDP) oxide layer, may be changed into a silicon rich oxide layer due to diffusion of Si from the SRON layer to the silicon oxide layer so that the surface of the HDP oxide layer becomes vulnerable to breakage. That is, the surface of the HDP oxide layer becomes brittle.

As a result, the interlayer characteristics between the silicon rich oxide layer and the silicon nitride layer deteriorate. In other words, since the silicon nitride layer may also become significantly brittle, it can be easily separated and lifted from other layers. The silicon nitride layer to be used as the etching stop layer may be generally deposited to form a low pressure nitride at a low pressure atmosphere as in a furnace, in which the low pressure nitride is grown with a significant tensile stress. Thus, the silicon nitride layer may be lifted due to such tensile stress and the brittle surface of the silicon oxide layer.

Oxygen plasma treatment may be performed on the surface of the silicon oxide layer such that a silicon rich portion of the silicon oxide layer is reduced into the normal oxide layer. In other words, the silicon rich portion can be reduced into the normal oxide layer through induction of oxidation by supplying oxygen radicals or ions, or mixtures of radicals and ions. Additionally, a silicon contaminated oxide can be removed from the surface of the silicon oxide layer by surface etching of the plasma of oxygen through application of a bias to the substrate.

After the surface of the silicon oxide layer is processed by the plasma of oxygen, a silicon nitride layer is deposited thereon by CVD or PE-CVD. The silicon nitride layer preferably has a significantly high compressive stress via the PE-CVD. For example, the compressive stress is about −8E9 dyne/$cm^2$.

As such, layer-lifting of the silicon nitride can be prevented by curing the contaminated portion of the silicon oxide layer with the plasma of oxygen and modifying a stress mode of the silicon nitride.

Figure 3:
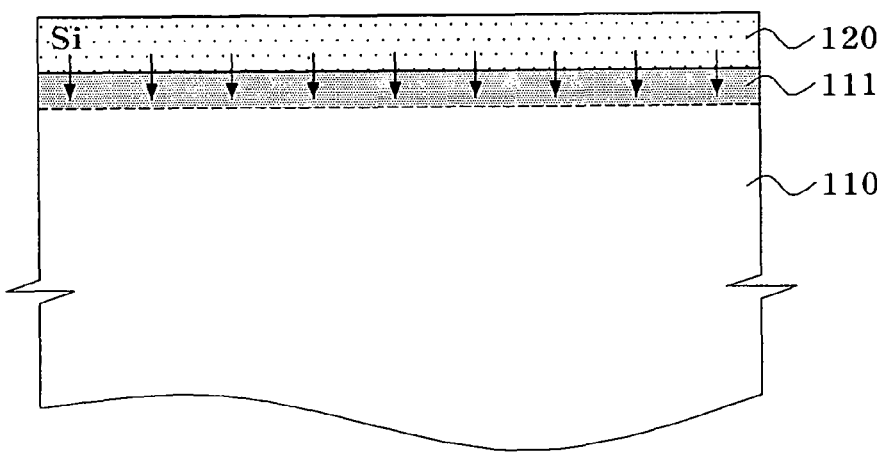
FIGS. 3 to 5 are schematic cross-sectional views showing steps of a method for manufacturing a semiconductor device free from layer-lifting between insulating layers according to a first embodiment of the invention.
Figure 4:
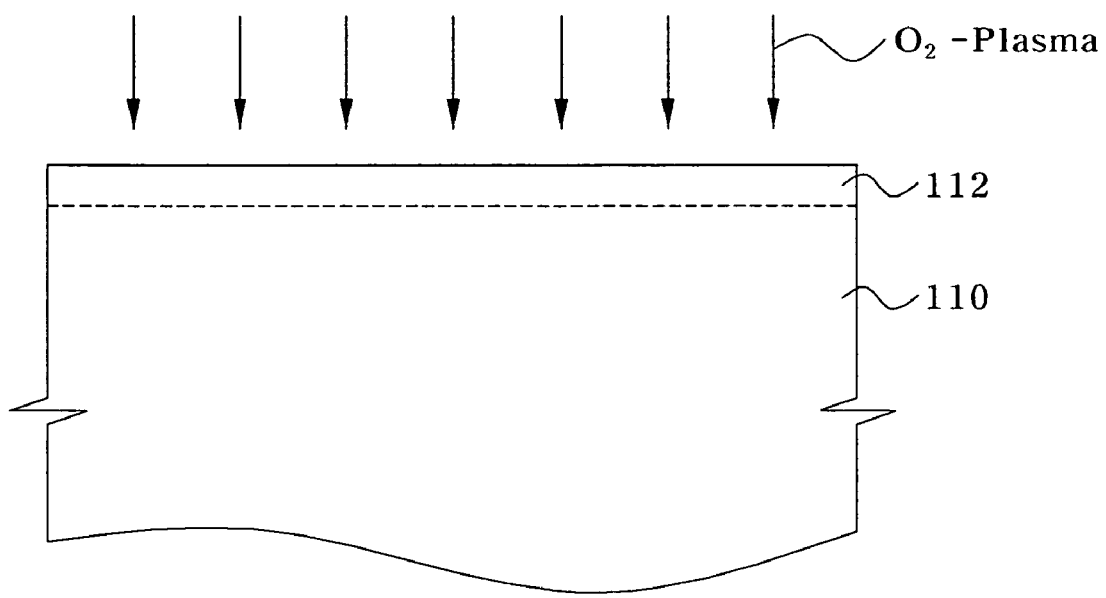
Figure 5:
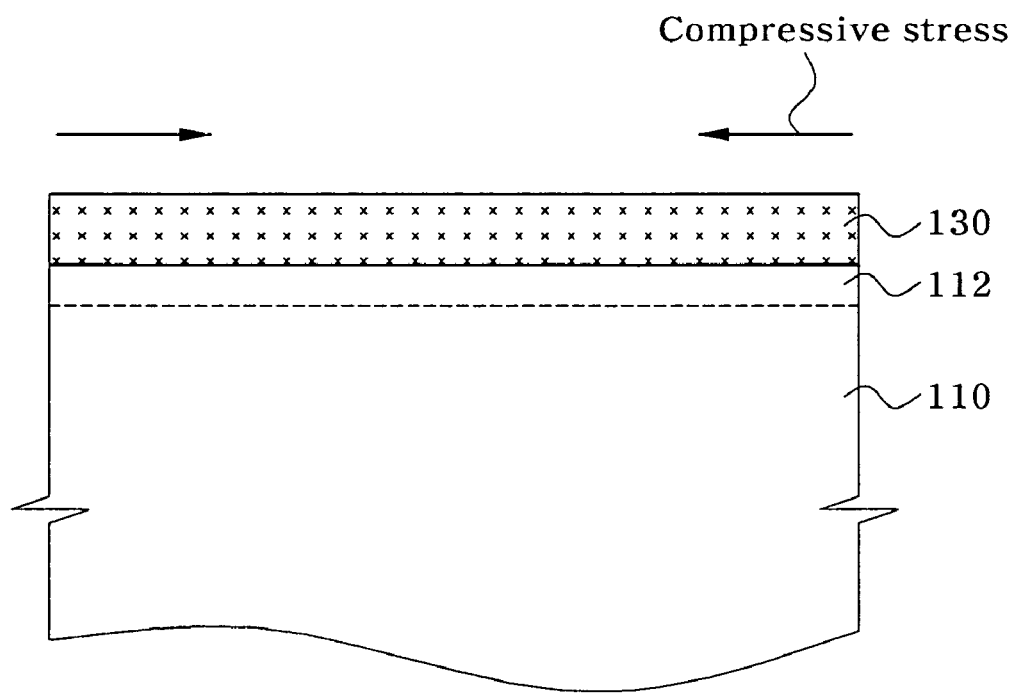

FIGS. 3 to 5 are schematic cross-sectional views showing a first embodiment of the invention.

Referring to FIG. 3, a silicon oxide ($SiO_2$) layer 110 is formed as an insulating layer on a semiconductor substrate (not shown). The silicon oxide layer 110 may comprise an HDP oxide, for example.

Then, an SRON layer 120 is formed as an etching mask or a hard mask on the silicon oxide layer 110. After selectively etching the silicon nitride layer 110 to form a predetermined pattern by use of the hard mask of the SRON layer 120, the SRON mask 120 used as the etching mask is selectively removed.

Here, an upper section 111 of the silicon oxide layer 110 brought into contact with the SRON layer 120 is contaminated due to diffusion of Si atoms and the like which are contained in high concentration in the SRON layer 120. That is, due to the diffusion of Si atoms, the upper section 111 of the silicon oxide layer 110 becomes a silicon rich oxide 111 which comprises an excessive amount of Si. The silicon rich oxide is more brittle than a normal silicon oxide ($SiO_2$). As a result, the interlayer characteristics with respect to a subsequent layer can deteriorate. In order to prevent this problem, the method of the invention includes a surface treatment process to recover the contaminated section 111.

Referring to FIG. 4, after selectively removing the SRON layer 120 (see FIG. 3), the exposed surface of the silicon oxide layer 110 is surface-treated using plasma of a reaction gas comprising oxygen such as, for example, a reaction gas comprising oxygen ($O_2$) and helium (He) as an inert gas. With the oxygen plasma treatment, silicon of the silicon rich oxide is oxidized so that the contaminated section 111 is changed to the normal oxide section 112. Here, the normal oxide can be understood as silicon dioxide ($SiO_2$).

The oxygen plasma treatment is preferably and illustratively performed by applying RF power of about 4,500 W having a relatively low frequency to a reaction gas comprising 300 sccm of $O_2$ and 500 sccm of He to excite the reaction gas to plasma, and of applying a bias of RF power of about 400 W having a relatively high frequency to the rear side of the semiconductor substrate. At this time, the surface of the silicon oxide 110 is partially removed by application of the bias during the surface treatment. For example, the surface of the silicon oxide 110 is removed by a thickness of about 100 Å, and the contaminated section 111 can be removed along with surface modification.

At this time, the rear side of the semiconductor substrate is preferably cooled via circulation of He refrigerant. If the rear side of the semiconductor substrate is not cooled, the substrate is excessively exposed to the plasma for a significant period of time, and thus reliability of a gate oxide layer can be lowered due to plasma induced damage, causing a problem with gate oxide integrity.

Referring to FIG. 5, a silicon nitride layer 130 is formed on the surface treated silicon oxide layer 110. The silicon nitride layer 130 is provided as an etching stop layer. Here, the silicon nitride layer 130 may be deposited to have the compressive stress by the PE-CVD. For example, the silicon nitride layer 130 is preferably deposited by plasma generated through application of RF power of about 470 W to a reaction gas which comprises about 45 sccm of silane gas ($SiH_4$) as a silicon source, about 27 sccm of ammonia gas as a nitride source, and about 4,500 sccm of nitrogen ($N_2$) gas as an inert atmosphere gas. At this time, the silicon nitride layer 130 preferably has a compressive stress of about −8E9 dyne/$cm^2$.

Figure 1:
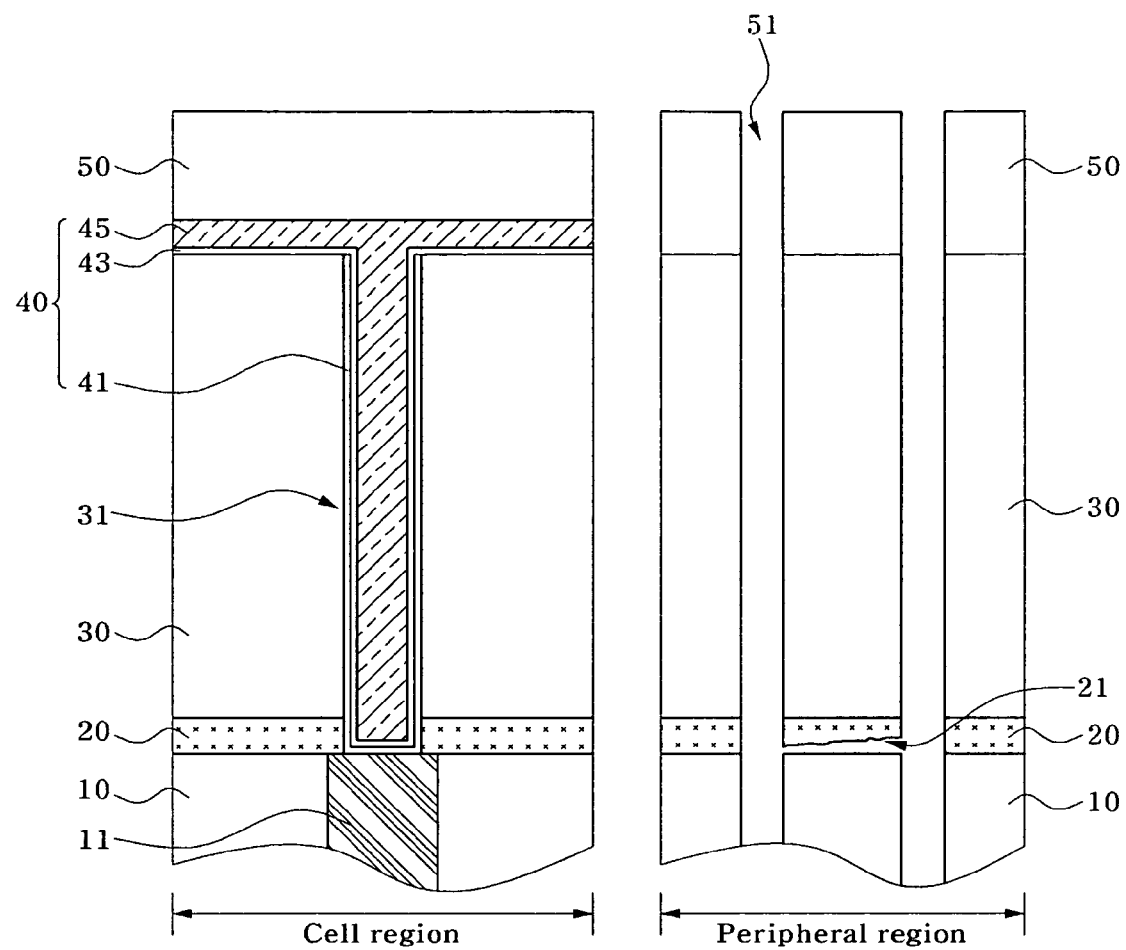
FIGS. 1 and 2 are schematic cross-sectional views showing a layer-lifting phenomenon of a silicon nitride layer in a conventional semiconductor device.
Figure 2:
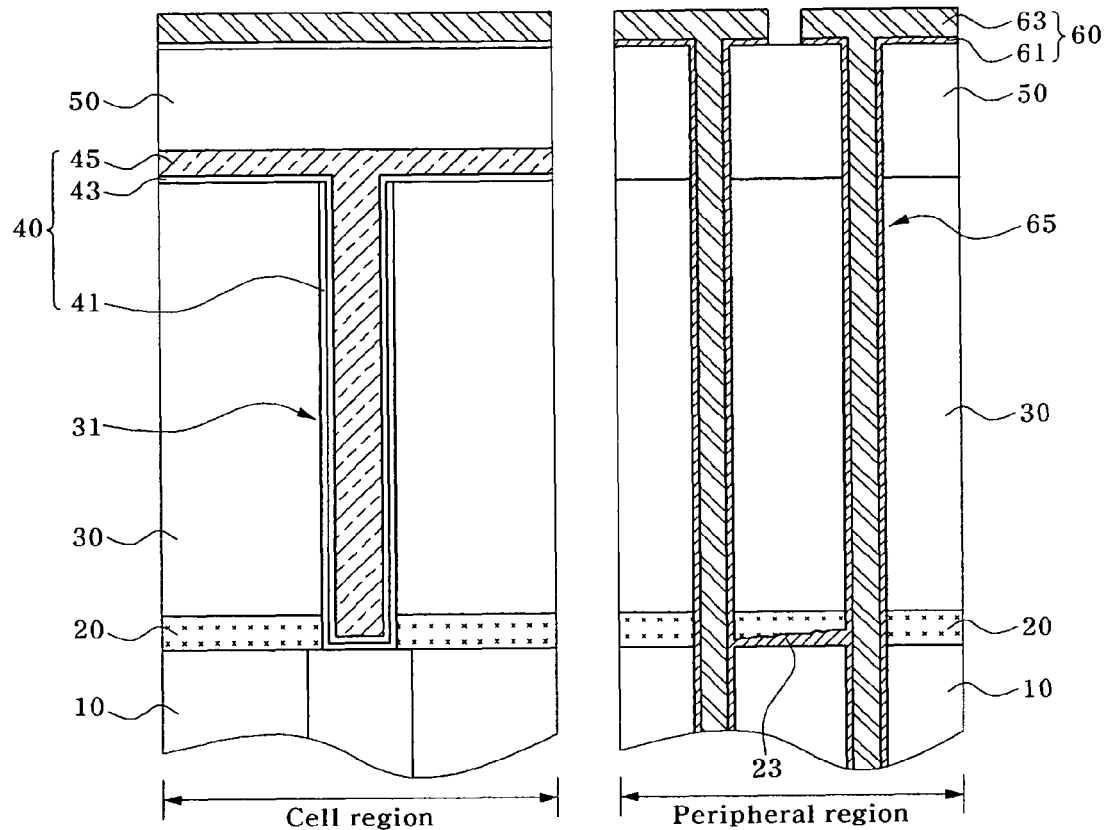

As such, it is possible to prevent the silicon nitride layer 130 from being lifted from the silicon oxide layer 110 by modifying the contaminated section 111 (see FIG. 1) into the normal surface 112 (see FIG. 2) through the plasma treatment, and depositing the silicon nitride layer 130 which has the compressive stress thereon.

Such an insulating layer structure of the first embodiment of the invention can be provided when forming a cylindrical capacitor, and prevent a bridge phenomenon caused by cracks and the like when subsequently forming metal contacts and metal lines, for example, M1 and M1C.

FIGS. 6 to 14 are schematic cross-sectional views showing a second embodiment of the invention. In the second embodiment, a silicon nitride layer is illustrated as being used as an etching stop layer when forming a cylindrical capacitor for a DRAM device. Here, an SRON layer is formed as an etching mask (or hard mask) when forming a contact hole for connection contact at a lower portion of the capacitor.

Figure 6:
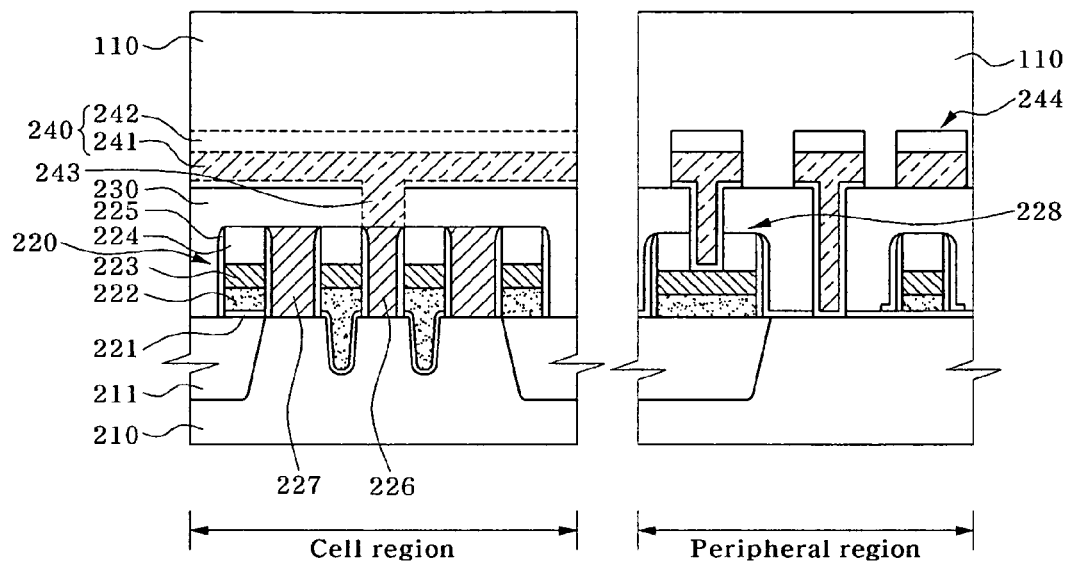
FIGS. 6 to 14 are schematic cross-sectional views showing steps of a method for manufacturing a semiconductor device free from layer-lifting between insulating layers according to a second embodiment of the invention.

Referring to FIG. 6, an isolation layer 211 for shallow trench isolation is preferably formed on a semiconductor substrate 210 which comprises a cell region and a peripheral region. Then, a cell-transistor and a peripheral-transistor are respectively formed on the cell region and the peripheral region through a process of forming transistors. At this time, a cell gate stack 220 and a peripheral gate stack 228 for the transistors are formed simultaneously, and may comprise layers, such as a gate oxide layer 221, a conductive polysilicon layer 222, a tungsten silicide ($WSi_x$) layer 223, a silicon nitride capping layer 224, a gate spacer 225, etc.

Then, a first insulating layer 230 is formed to fill the gate stacks 220 and 228, and preferably comprises a silicon oxide. The first insulating layer 230 may be formed by stacking multiple insulating layers, and contact pads 226 and 227 comprising, for example, conductive polysilicon layers are formed to penetrate the cell gate stack 220. The contact pads 226 and 227 can be divided into a bit line connection contact pad 226 connected to bit lines 240, and a storage electrode connection contact pad 227 connected to the capacitor.

The bit lines 240 are formed on the first insulating layer 240 by deposition of metallic materials such as titanium nitride (TiN) or titanium (Ti), and comprise a barrier metal layer 241 and a tungsten layer 242. At this time, a bit line connection contact 243 can be simultaneously formed to penetrate the first insulating layer 230, and connect in alignment to the bit line connection contact pad 226.

On the peripheral region, a metal contact pad 244 is formed along with the bit lines 240 to connect in alignment to the metal contact. The metal contact pad 244 serves to connect the metal line layer to the gate stack 228 or to the semiconductor substrate 210 therebelow.

Then, a second insulating layer 110 is formed over the bit lines 240 to insulate the bit lines 240. At this time, the second insulating layer 110 may comprise a material having a low dielectric constant (k) for disturbance of signals between the bit lines 240 and/or reduction in electrostatic capacitance of a parasite capacitor. In this case, the second insulating layer 110 may be formed in a multi-insulating layer structure in which the uppermost layer may comprise an HDP oxide layer having a relatively high density to suppress the diffusion.

Figure 7:
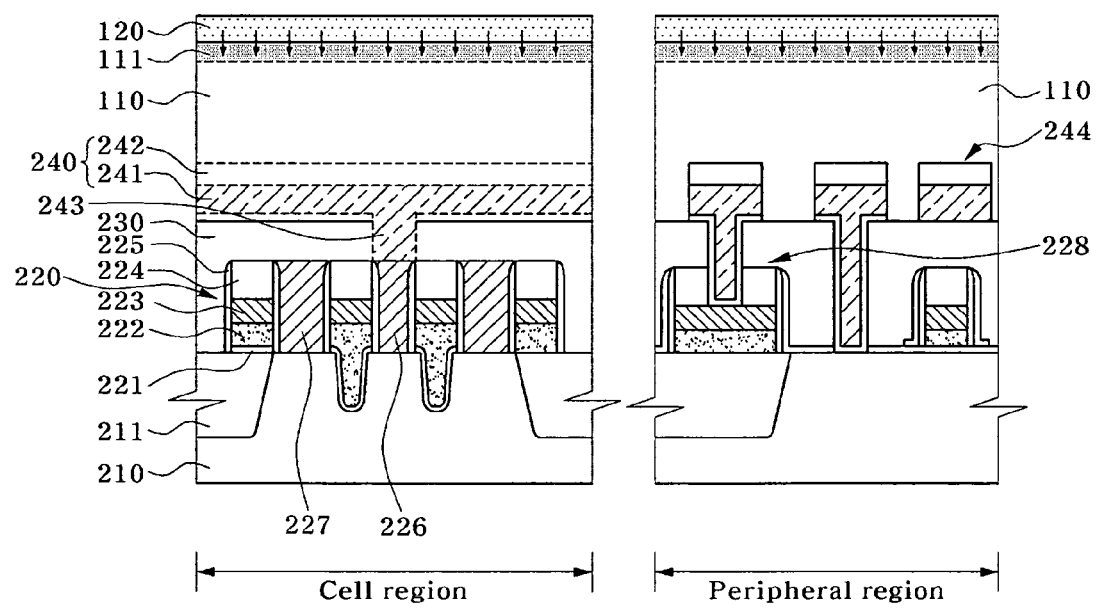

Referring to FIG. 7, in a Capacitor-Over-Bit-Line (COB) structure wherein the capacitor is formed over the bit lines 240, connection contacts are aligned on the storage electrode connection contact pad 227 to electrically connect the capacitor to the transistor of the semiconductor substrate 210. For this purpose, selective etching is performed to form contact holes for the connection contacts. At this time, to implement the contact holes, each having a more precise and smaller line width, a hard mask providing a higher selection ratio during the selective etching is used as an etching mask.

For example, an SRON layer 120 is preferably formed as the hard mask on the second insulating layer 110 which comprise a silicon oxide ($SiO_2$). As the SRON layer 120 is formed on the second insulating layer 110, a surface layer 111 of the second insulating layer 110 contacting the SRON layer 120 can be contaminated due to diffusion of silicon atoms, and thus can be changed into a silicon rich oxide which is more brittle than the normal silicon oxide.

Figure 8:
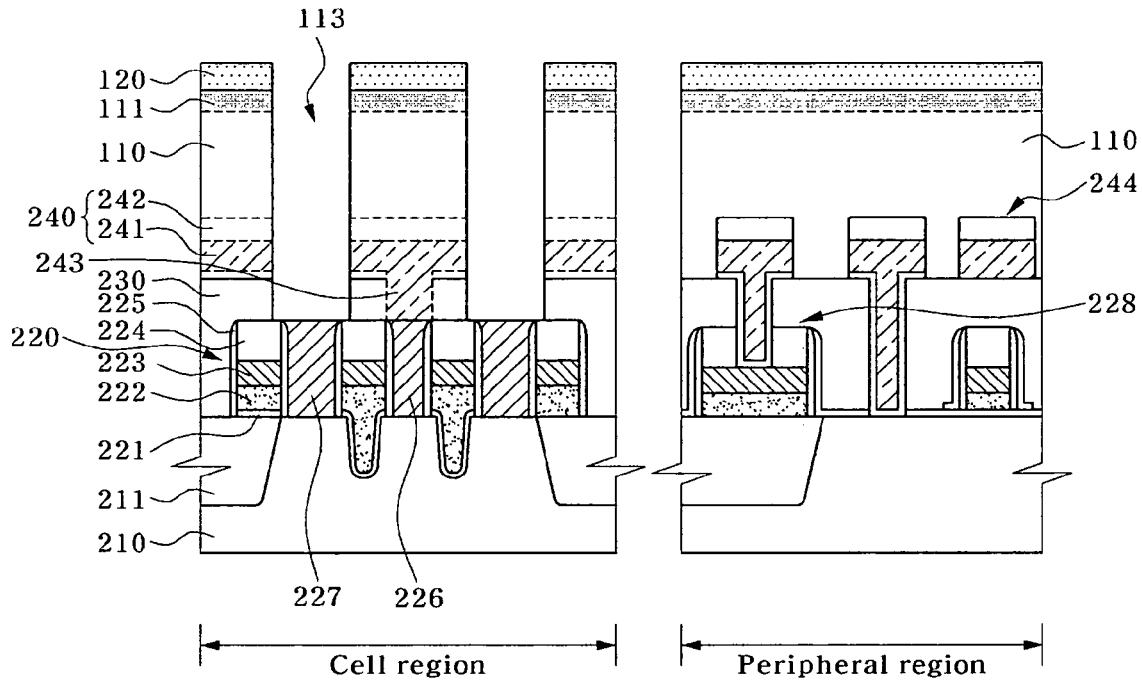

Referring to FIG. 8, after the hard mask is formed by etching the SRON layer 120 to have a predetermined pattern, the second exposed insulating layer 110 is selectively etched through the hard mask, forming a first contact hole 113 which exposes the contact pad 227 at the lower portion.

Figure 9:
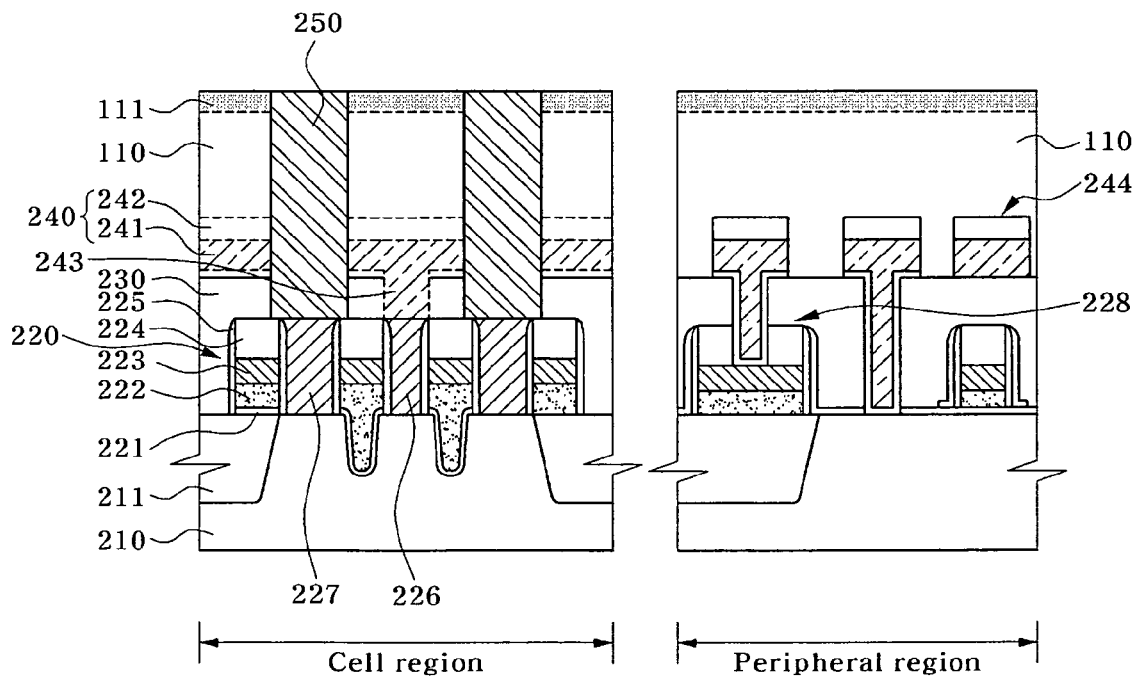

Referring to FIG. 9, after depositing a conductive layer, for example, a polysilicon layer, to fill the first contact hole 113, a connection contact 250 is formed by etch-back or chemical mechanical polishing. Then, the SRON layer 120 is selectively removed.

Figure 10:
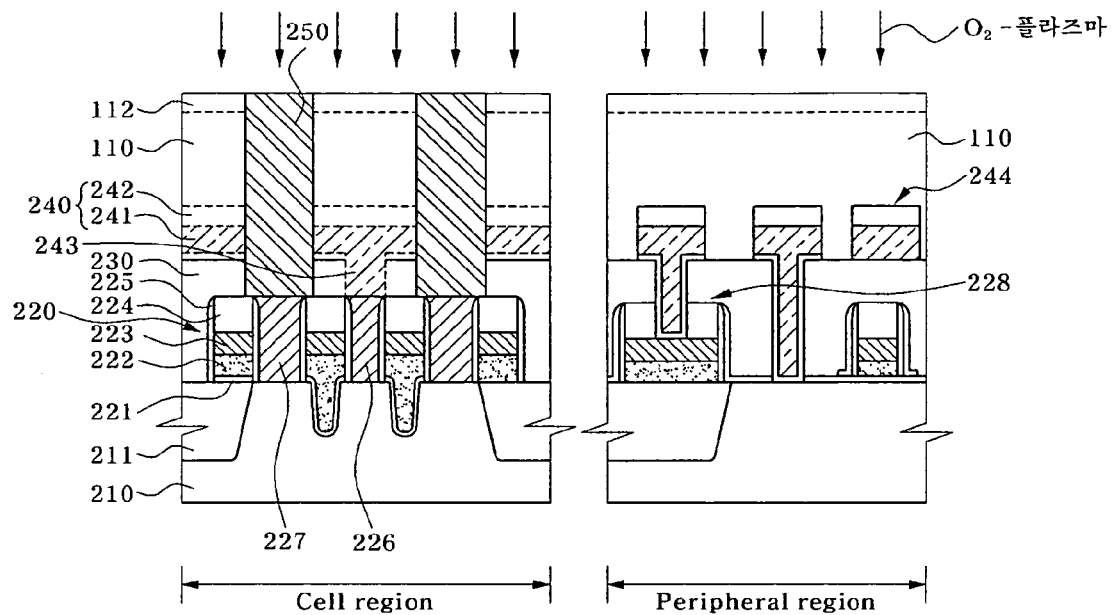

Referring to FIG. 10, surface treatment is performed on the surface of the second insulating layer 110, from which the SRON layer 120 is removed, by using plasma of a reaction gas containing oxygen, for example, oxygen plasma. As a result, the contaminated surface layer 111 (see FIG. 9) of the second insulting layer 110 is recovered to the normal silicon oxide. The surface layer 111 is modified into a normal silicon oxide layer 112. That is, the surface treatment induces generation of the normal silicon oxide ($SiO_2$) via oxidation between oxygen radicals or ions of the oxygen plasma and silicon atoms excessively contained in the surface layer so that the surface layer contaminated by silicon is modified into the normal silicon oxide.

The oxygen plasma treatment is preferably performed in such a way of applying RF power of about 4,500 W having a relatively low frequency to a reaction gas comprising, for example, 300 sccm of $O_2$ and 500 sccm of He to excite the reaction gas to plasma, and of applying a bias of RF power of about 400 W having a relatively high frequency to the rear side of the semiconductor substrate. At this time, the surface layer 112 of the second insulating layer 110 can be partially removed by application of the bias. For example, the surface layer 112 of the second insulating layer 110 is preferably removed by a thickness of about 100 Å, and the contaminated surface can be removed along with surface modification.

At this time, the rear side of the semiconductor substrate 210 is preferably cooled via circulation of He refrigerant. If the rear side of the substrate 210 is not cooled, the substrate 210 is excessively exposed to the plasma for a significantly long period of time, and thus reliability of a gate oxide layer 221 can be lowered due to plasma induced damage, causing a problem with gate oxide integrity (GOI).

Figure 11:
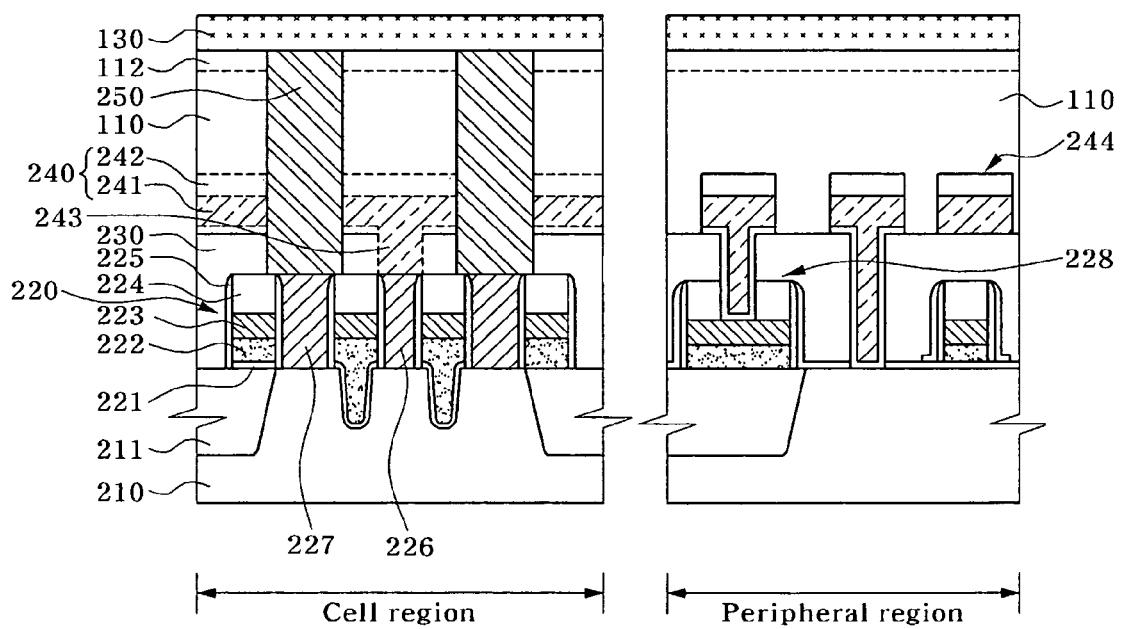

Referring to FIG. 11, a silicon nitride layer 130 is formed on the silicon oxide layer 110, of which surface is modified to avoid brittleness. It can be understood that the silicon nitride layer 130 is provided to serve as an etching stop layer.

Here, the silicon nitride layer 130 is preferably deposited thereon to have the compressive stress by plasma-enhanced chemical vapor deposition (PE-CVD). For example, the silicon nitride layer 130 is preferably deposited by plasma generated through application of RF power of about 470 W to a reaction gas which comprises about 45 sccm of silane gas ($SiH_4$) as a silicon source, about 27 sccm of ammonia gas as a nitride source, and about 4,500 sccm of nitrogen ($N_2$) gas as an inert atmosphere gas. The silicon nitride layer 130 preferably has a compressive stress of about −8E9 dyne/cm$^2$.

As such, it is possible to prevent the silicon nitride layer 130 from being lifted from the second insulating layer 110 by modifying the contaminated surface layer 111 (see FIG. 9) into the normal surface 112 (see FIG. 10) through the plasma treatment, and depositing the silicon nitride layer 130 having the compressive stress thereon.

Figure 12:
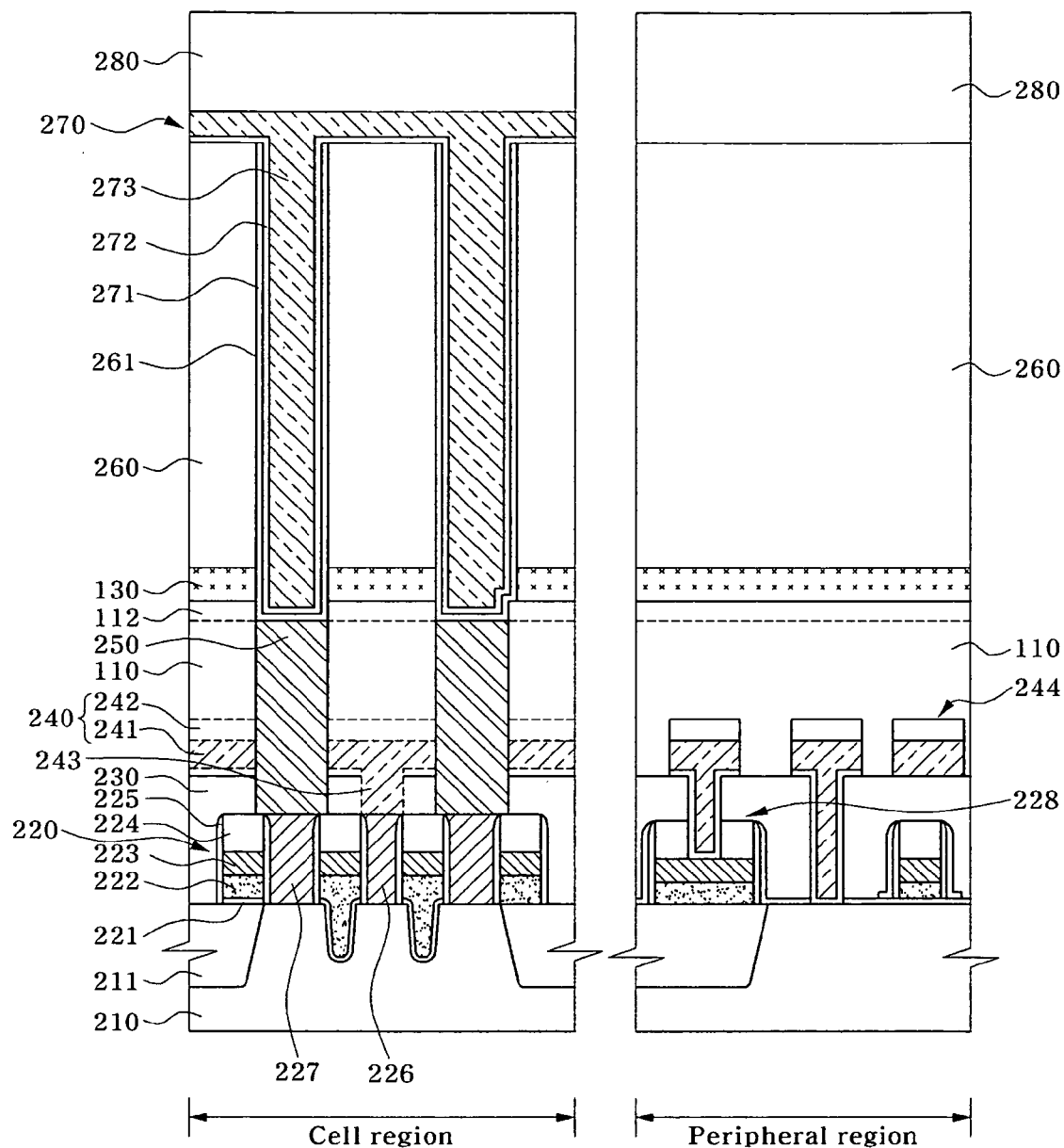

Referring to FIG. 12, a mold layer 260 is formed on the silicon layer 130, and preferably comprises a silicon oxide layer. Then, the mold layer 260 is selectively etched to form a via-opening hole 261 which is aligned to a connection contact 250 for connection with the storage electrode. Here, the silicon nitride layer 130 may be formed as an etching stop layer.

Next, a cylindrical capacitor 270 is formed in the via-opening hole 261, preferably by stacking a storage electrode 271 of a polysilicon layer, a dielectric film 272, and a plate electrode 273 of a conductive polysilicon layer therein. After forming the storage electrode 271, the mold layer 260 is preferably selectively etched through the silicon nitride layer 130 serving as the etching stop layer such that the dielectric film 272 extends onto an outer wall of the storage electrode 271, thereby further increasing capacitance of the capacitor 270.

Then, a third insulating layer 280 is formed to cover the plate electrode 273. The mold layer 260 can be maintained as an insulating layer below the third insulating layer 280.

Figure 13:
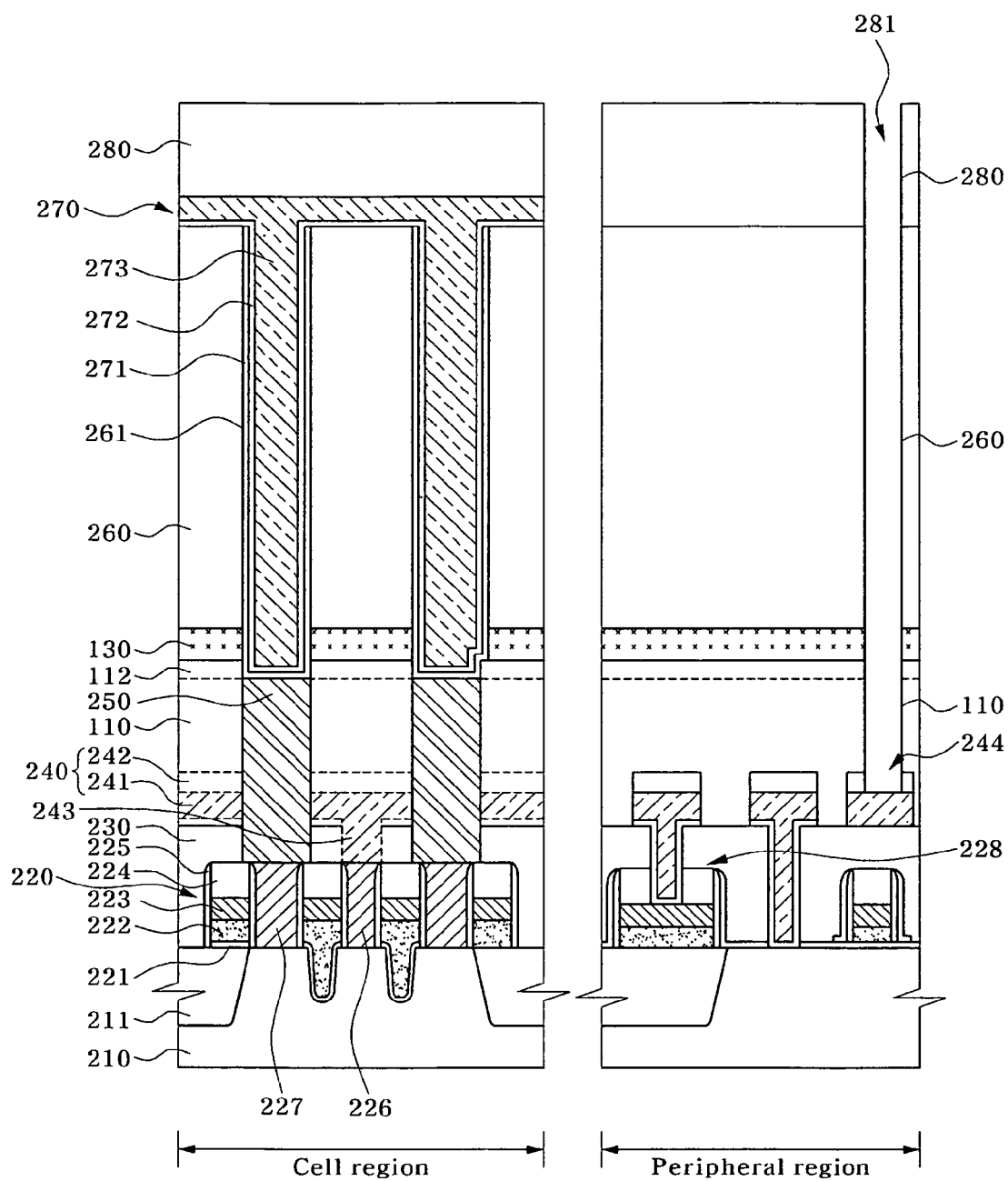

Referring to FIG. 13, a second contact hole 281 is formed to penetrate the third insulating layer 280 and the mold layer 260, and exposes the semiconductor substrate 210 or the contact pad 244 for connection to the metal contact. The second contact hole 281 is the contact hole for the metal contact, such as M1C, which connects the line layer to the device. At this time, since layer-lifting is prevented at a location of the silicon nitride layer 130, cracks are not exposed to the second contact hole 281 from the interface of the silicon nitride layer 130.

Figure 14:
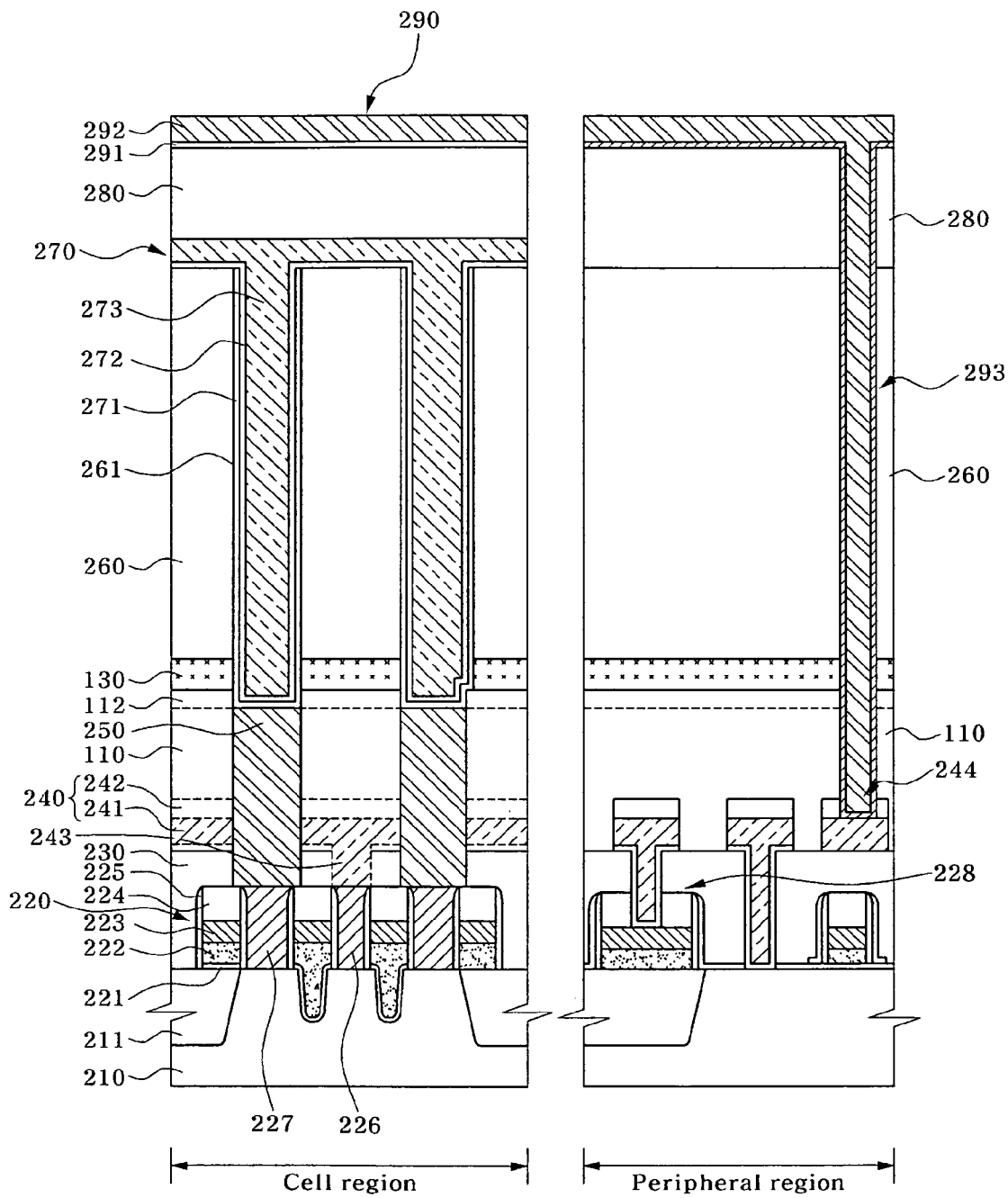

Referring to FIG. 14, conductive line layers 290, for example, M1 line layers 290, are formed to fill the second contact hole 281. The metal contact 293, that is, M1C, can be deposited along with the line layers 290. The line layers 290 may comprise a metal barrier layer 291 and a metal line layer 292. For example, the metal barrier layer 291 may be formed from a titanium nitride layer using $TiCl_4$ as a titanium source by CVD, and the line layer 290 may be formed by depositing an aluminum layer on the metal barrier layer 291.

With this process, the silicon nitride layer 130 is suppressed from being lifted so that the cracks are prevented from being generated and are not exposed to the side of the second contact hole 281. As a result, it is possible to effectively prevent a bridge phenomenon or a short-circuit phenomenon which causes the metal contact 293 to connect to the metal contact 293 adjacent thereto when forming the metal barrier layer 291.

As apparent from the above description, the method according to the invention can effectively prevent layer-lifting and/or void-defect which can occur due to inferior characteristics of the interface between a silicon nitride layer acting as an etch stop layer and a silicon oxide layer. As a result, the method of the invention can effectively prevent the short-circuit phenomenon between metal contacts, thereby embodying an increase in yield of a semiconductor manufacturing process.

The embodiments and the accompanying drawings have been described for illustrative purposes and the invention is limited only by the following claims. Further, those skilled in the art will appreciate that various modifications, additions and substitutions are allowed without departing from the scope and spirit of the invention as set forth in the accompanying claims.

What is claimed is:

1. A method for manufacturing a semiconductor device, comprising:
    forming a silicon oxide layer over a semiconductor substrate;
    forming a silicon-rich oxynitride (SRON) layer directly on the silicon oxide layer, the SRON layer causing silicon contamination on a contacting surface portion of the silicon oxide layer by silicon diffusion from the silicon rich oxynitride layer;
    patterning the SRON layer to form an etching mask;
    etching a portion of the silicon oxide layer exposed by the etching mask to form a first contact hole;
    forming a conductive layer to fill the first contact hole to form a connection contact;
    removing all of the remaining SRON layer from the silicon oxide layer to expose an entire top surface of the silicon oxide layer;
    performing surface treatment on the exposed top surface of the silicon oxide layer by using plasma of a reaction gas containing oxygen to oxidize the silicon contaminated surface portion to recover into silicon oxide;
    forming a silicon nitride layer directly on the surface of the recovered silicon oxide portion of the silicon oxide layer;
    forming a mold layer over the silicon nitride layer;
    selectively etching the mold layer, in a first region of the semiconductor substrate, using the silicon nitride layer as an etching stop layer to form an opening hole through the mold layer and etching a portion of the silicon nitride layer exposed by the opening hole;
    forming a storage electrode, a dielectric layer, and a plate electrode in the opening hole;
    forming an upper insulating layer over the plate electrode;
    etching, in a second region of the semiconductor substrate, the upper insulating layer, the mold layer, the silicon nitride layer, and the silicon oxide layer to form a second contact hole; and
    forming a metal layer over the upper insulating layer to fill the second contact hole to form a metal line layer with a metal contact.

2. The method according to claim 1, further comprising:

etching the silicon oxide layer using the SRON layer as the etching mask to form a third contact hole; and forming a conductive layer to fill the third contact hole to form a connection contact connected to the storage electrode.

3. The method according to claim 1, comprising performing the surface treatment in such a way to process the surface of the silicon oxide layer using the plasma generated from the reaction gas comprising oxygen ($O_2$) gas and helium (He) gas.

4. The method according to claim 1, wherein the surface treatment comprises applying a bias toward the semiconductor substrate to allow the surface of the silicon oxide layer to be etched by the plasma.

5. The method according to claim 4, comprising cooling a rear surface of the semiconductor substrate by circulating a helium refrigerant to prevent damage caused by the plasma while the bias is applied.

6. The method according to claim 1, comprising depositing the silicon nitride layer by plasma enhanced chemical vapor deposition (PE-CVD) to have compressive stress.

* * * * *